United States Patent [19]

Clark

[11] Patent Number: 5,253,325
[45] Date of Patent: Oct. 12, 1993

[54] DATA COMPRESSION WITH DYNAMICALLY COMPILED DICTIONARY

[75] Inventor: Alan D. Clark, Ipswich, England

[73] Assignee: British Telecommunications public limited company, London, England

[21] Appl. No.: 688,552

[22] PCT Filed: Dec. 8, 1989

[86] PCT No.: PCT/GB89/01469

§ 371 Date: Jun. 25, 1991

§ 102(e) Date: Jun. 25, 1991

[87] PCT Pub. No.: WO90/06560

PCT Pub. Date: Jun. 14, 1990

[30] Foreign Application Priority Data

Dec. 9, 1988 [GB] United Kingdom ............... 8828796

[51] Int. Cl.$^5$ .............................................. G10L 9/04
[52] U.S. Cl. .............................................. 395/2
[58] Field of Search ............................ 381/29–47; 395/2; 341/51, 67, 65, 79, 87

[56] References Cited

U.S. PATENT DOCUMENTS 4,876,541 10/1989 Storer .................. 341/67
5,153,591 10/1992 Clark .................. 341/51

FOREIGN PATENT DOCUMENTS 0127815 12/1984 European Pat. Off. .
0280549 8/1988 European Pat. Off. .

OTHER PUBLICATIONS

Calingaert, *Assemblers, Compilers, and Program Translation*, Computer Science Press, 1979, pp. 195–196.
Storer—"Data Compression," Computer Science Press, 1988, pp. 69–74.
Computer Journal, vol. 18, No. 2, 1975, A. Mayne et al: "Information compression by factorising common strings", pp. 157–160.
Proc. Very Large Databases, Cannes, 9–11, Sep. 1981 IEEE, (New York, US), C. A. Lynch et al: "Application of data compression techniques to a large bibliographic database", pp. 435–447.

*Primary Examiner*—Allen R. MacDonald
*Assistant Examiner*—Michelle Doerrler
*Attorney, Agent, or Firm*—Nixon & Vanderhye

[57] ABSTRACT

A data compression system in which a dictionary stored strings of characters and an encoder matches the longest of the stored string with a current string of a data stream input to the encoder. The index of the longest matched stored string is output by the encoder and the dictionary is updated by a new string consisting of the previous match concatenated with the first two characters only of the present match. If the present match has only one or two characters, it is added without reduction.

5 Claims, 2 Drawing Sheets

DATA COMPRESSION WITH DYNAMICALLY COMPILED DICTIONARY

BACKGROUND OF THE INVENTION

1. Field of the Invention

The present invention relates to data compression systems which may be used, for example, to reduce the space required by data for storage in a mass storage device such as a hard disk, or to reduce the bandwidth required to transmit data.

2. Background Art

The invention is particularly concerned with data compression systems using dynamically compiled dictionaries. In such systems (see, for example, EP-A-0127815, Miller and Wegman) an input data stream is compared with strings stored in a dictionary. When characters from the data stream have been matched to a string in the dictionary the code for that string is read from the dictionary and transmitted in place of the original characters. At the same time when the input data stream is found to have character sequences not previously encountered and so not stored in the dictionary then the dictionary is updated by making a new entry and assigning a code to the newly encountered character sequence. This process is duplicated on the transmission and reception sides of the compression system. The dictionary entry is commonly made by storing a pointer to a previously encountered string together with the additional character of the newly encountered string.

SUMMARY OF THE INVENTION

According to a first aspect of the present invention there is provided a data compression system including a dictionary to store strings of characters with an index for each of said strings, and means for matching strings of characters of a data stream with strings of characters stored in the dictionary and for outputting the identity of a dictionary entry of a matched string when a following character of the data stream does not match with the stored strings, characterized in that the means for matching is arranged to determine, for each matched string having at least three characters, a sequence of characters from the at least three characters, the sequence including at least a first and a second of said at least three characters, to update the dictionary by extending an immediately-preceding matched string by the sequence.

According to a second aspect there is provided a method of data compression of individual sequences of characters in a data stream including the steps of storing strings in a dictionary with an index for each of said strings, and determining the longest string in the dictionary which matches a current string in the data stream starting from a current input position: the improvement including the steps of determining, for each matched string having at least three characters, a single sequence of characters from the said at least three characters, the single sequence including at least a first and a second of the at least three characters, but not including all of the at least three characters, and updating the dictionary by extending an immediately-preceding matched string by the single sequence.

Preferably, the previously matched string is extended by only the first two characters of said following multiple character matched string.

Preferably, the data compression system compresses data using a Mayne single-pass data compression algorithm.

In known systems, dictionary entries are made either by combining the single unmatched character left over by the process of searching for the longest string match with the preceding matched string or by making entries comprising pairs of matched strings. The former is exemplified by the Ziv Lempel algorithm ("Compression of Individual Sequences via Variable Rate Coding," J. Ziv, A. Lempel, IEEE Trans, IT 24.5, pp. 530–36, 1978), the latter by the conventional Mayne algorithm (Information Compression by Factorizing Common Strings," A. Mayne, E. B. James, *Computer Journal*, vol. 18.2, pp. 157–60, 1975), and EP-A-012815, Miller and Wegman, discloses both methods. The preferred example of the present invention uses the Mayne data compression algorithm but modifies the process of updating the dictionary so that the entries comprise a matched string and part of the following matched string rather than pairs of whole matched strings. The inventor has found that this confers significant advantages in the efficiency of operation of the algorithm and that these advantages are particularly marked in the case where just two characters from the second of the pair of matched strings are taken to form the dictionary entry.

One embodiment of the present invention is described in detail and contrasted with the prior art in the following technical description.

DESCRIPTION OF THE PREFERRED EMBODIMENT

By way of background to the present invention it is convenient first to refer to known prior art data compression systems. The Mayne algorithm (1975) predates the Ziv Lempel algorithm by several years, and has a number of features which were not built in to the Ziv Lempel implementations until the 1980's. The Mayne algorithm is a two pass adaptive compression scheme.

As will the Ziv Lempel algorithm, the Mayne algorithm represents a sequence of input symbols by a codeword. This is accomplished using a dictionary of known strings, each entry in the dictionary having a corresponding index number or codeword. The encoder matches the longest string of input symbols with a dictionary entry, and transmits the index number of the dictionary entry. The decoder receives the index number, looks up the entry in its dictionary, and recovers the string.

Figure 2:
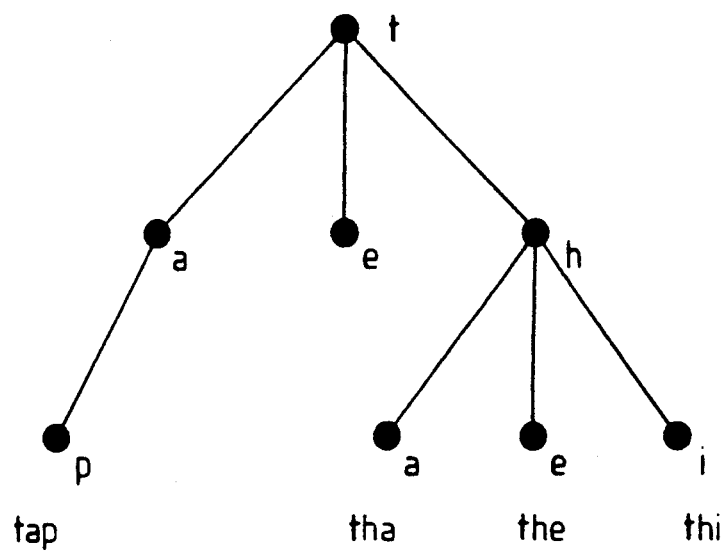
FIG. 2 is a tree representative of a number of dictionary entries in a dictionary structured in accordance with the prior art.

The most complex part of this process is the string matching or parsing performed by the encoder, as this necessitates searching through a potentially large dictionary. If the dictionary entries are structured as shown in FIG. 2, however, this process is considerably simplified. The structure shown in FIG. 2 is a tree representation of the series of strings beginning with "t"; the initial entry in the dictionary would have an index number equal to the ordinal value of "t".

To match the incoming string "the quick . . . ," the initial character "t" is read and the corresponding entry immediately located (it is equal to the ordinal value of "t"). The next character "h" is read and a search initiated among the dependents of the first entry (only 3 in this example). When the character is matched, the next input character is read and the process repeated. In this manner, the string "the" is rapidly located and when the encoder attempts to locate the next character, " ", it is immediately apparent that the string "the " is not in the dictionary. The index value for the entry "the" is transmitted and the string matching process recommences with the character " ". This is based on principles which are well understood in the general field of sorting and searching algorithms ("The Art of Computer Programming," vol. 3, Sorting and Searching, D. Knuth, Addison Wesley, 1968).

The dictionary may be dynamically updated in a simple manner. When the situation described above occurs, i.e., string S has been matched, but string S+c has not, the additional character c may be added to the dictionary and linked to entry S. By this means, the dictionary above would now contain the string "the " and would achieve improved compression the next time the string is encountered.

The two pass Mayne algorithm operates in the following way:

(a) Dictionary construction

Find the longest string of input symbols that matches a dictionary entry, call this the prefix string. Repeat the process and call this second matched string the suffix string. Append the suffix string to the prefix string, and add it to the dictionary. This process is repeated until the entire input data stream has been read. Each dictionary entry has an associated frequency count, which is incremented whenever it is used. When the encoder runs out of storage space, it finds the least frequently used dictionary entry and reuses it for the new string.

(b) Encoding

The process of finding the longest string of input symbols that matches a dictionary entry is repeated, however when a match is found the index of the dictionary entry is transmitted. In the Mayne two pass scheme, the dictionary is not modified during encoding.

The present invention is a modified version of the Mayne algorithm, however, some implementation details are contained in a copending U.S. patent application Ser. No. 623,809. The resource requirements in terms of memory and processing time are similar to those achieved by the modified Ziv-Lempel algorithm.

Referring now to the present invention, with small dictionaries, experience has shown that appending the complete string (as in Mayne, and Miller and Wegman) causes the dictionary to fill with long strings which may not suit the data characteristics well. With large dictionaries (say 4096+ entries) this is not likely to be the case. By appending the first two characters of the second string to the first, performance is improved considerably. The dictionary update process of the present invention therefore consists of appending two characters if the suffix string is two or more characters in length, or one character if the suffix string is of length 1. In other words, for a suffix string of three or more characters the encoder determines a sequence constituted by only the first two characters of the suffix string and appends this sequence to the previously matched string.

```
match(entry, input stream, character)
    string = character
    entry = ordinal value of character
    do(
        read next character from input stream and append to
        string search dictionary for extended string if extended
        string is found then
            entry = index of matched dictionary entry)
    while ( found )
    /* returns with entry = last matched entry, character = last
    character
    read */
    return
encode( input stream )
    do(
        /* match first string */
        match(entry, input stream, character )
        output entry
        /* match second string */
        match( entry, input stream, character )
        output entry
        append initial two characters of second entry to first
        and add to dictionary
    )
    while( data to be encoded )
```

Figure 1:
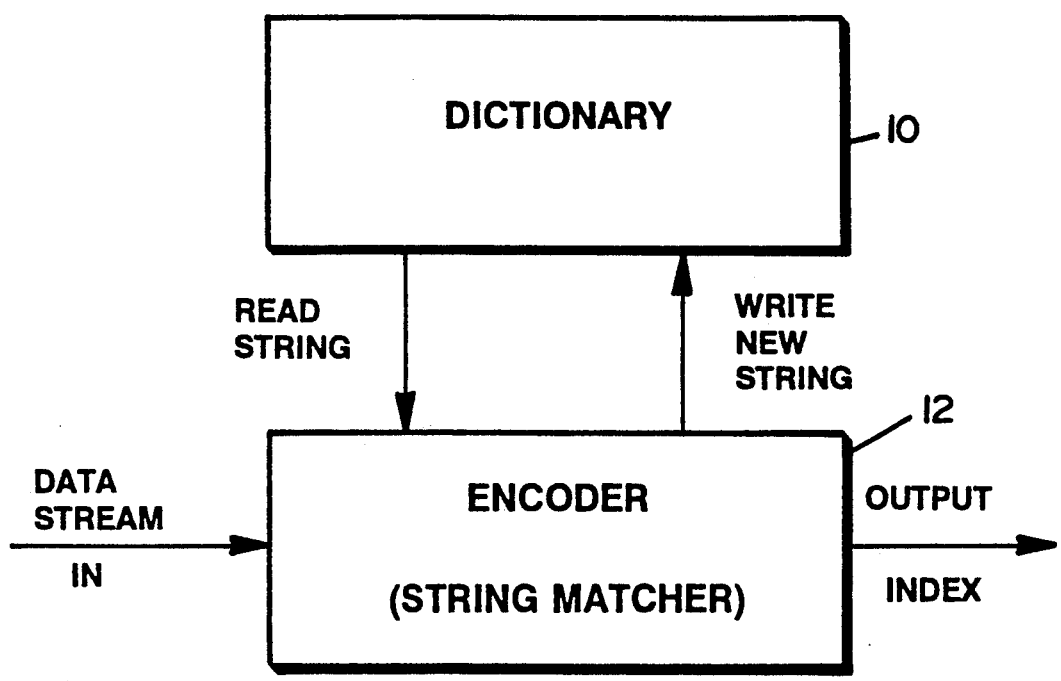
FIG. 1 is a block schematic diagram of a data compression system of the present invention.

The data compression system of FIG. 1 comprises a dictionary 10 and an encoder 12 arranged to read characters of an input data stream, to search the dictionary 10 for the longest stored string which matches a current string in the data stream, and to update the dictionary 10. As an example, the encoder of 12 performs the following steps where the dictionary contains the strings "mo", "us" and the word "mouse" is to be encoded using a modified version of the Mayne algorithm.

(i) Read "m" and the following character "o" giving the extended string "mo".

(ii) Search in the dictionary for "mo" which is present, hence, let entry be the index number of the string "mo".

(iii) Read the next character "u" which gives the extended string "mou".

(iv) Search the dictionary for "mou" which is not present.

(v) Transmit entry the index number of string "mo".

(vi) Reset the string to "u", the unmatched character.

(vii) Read the next character "s" giving the string "us".

(viii) Search the dictionary, and assign the number of the corresponding dictionary entry to entry.

(ix) Read the next character "e[ giving the extended string "use".

(x) Search the dictionary for "use", which is not present.

(xi) Transmit entry the index number of string "us".

(xii) Add the string "mo"+"us" to the dictionary.

(xiii) Start again with the unmatched "e."

(xiv) Read the next character . . .

If the dictionary had contained the string "use," then step (x) would have assigned the number of the corresponding dictionary entry, and step (xii) would still add the string "mo"+"us", even though the matched string was "use." Step (xiii) would relate to the unmatched character after "e."

Several other aspects of the algorithm need definition or modification before a suitable real time implementation is achieved. These relate to the means by which the dictionary is constructed, the associated algorithm, and storage recovery.

Many means for implementing the type of dictionary structure defined above are known. The Knuth document referred to above, discusses some of these, other are of more recent origin. Two particular schemes will be outlined briefly.

(i) Trie structure

U.S. patent application Ser. No. 623,809, now U.S. Pat. No. 5,153,591, on the modified Ziv-Lempel algorithm discusses a trie structure ("Use of Tree Structures for Processing Files," E. H. Susenguth, CACM, vol. 6.5, pp. 272-79, 1963), suitable for this application. This tree structure has been shown to provide a sufficiently fast method for application in modems. The scheme uses a linked list to represent the alternative characters for a given position in a string, and occupies approximately 7 bytes per dictionary entry.

(ii) Hashing

The use of hashing or scatter storage to speed up searching has been known for many years (for example, the Knuth document referred to above; "Scatter Storage Techniques," R. M. Morris, CACM, vol. 11.1, pp. 38-44, 1968; and Technical Description of BTLZ, British Telecom contribution to CCITT SGXVII.) The principle is that a mathematical function is applied to the item to be located, in the present case a string, which generates an address. Ideally, there would be a one-to-one correspondence between stored items and hashed addresses, in which case searching would simply consist of applying the hashing function and looking up the appropriate entry. In practice, the same address may be generated by several different data sets, collision, and hence some searching is involved in locating the desired items.

The key factor in the modified Mayne algorithm (and in fact in the modified Ziv-Lempel algorithm) is that a specified searching technique does not need to be used. As long as the process for assigning new dictionary entries is well defined, an encoder using the trie technique can interwork with a decoder using hashing. The memory requirements are similar for both techniques.

The decoder receives codewords from the encoder, recovers the string of characters represented by the codeword by using an equivalent tree structure to the encoder, and outputs them. It treats the decoded strings as alternately prefix and suffix strings, and updates its dictionary in the same way as the encoder.

It is interesting to note that the Kw problem described in "A Technique for High Performance Data Compression," T. Welch, *Computer*, June 1984, pp. 8-19, does not occur in the Mayne algorithm. This problem occurs in the Ziv-Lempel implementations of Welch, and Miller and Wegman, EP-A-0127815 because the encoder is able to update its dictionary one step ahead of the decoder.

```
decode
    do(
        receive codeword
        look up entry in dictionary
        output string
        save string as prefix
        receive codeword
        look up entry in dictionary
        output string
        append first two characters of string to prefix and
            add to dictionary)
```
```
while( data to be decoded )
```

The encoder's dictionary is updated after each suffix string is encoded, and the decoder performs a similar function. New dictionary entries are assigned sequentially until the dictionary is full, thereafter they are recovered in a manner described below.

The dictionary contains an initial character set, and a small number of dedicated codewords for control applications, the remainder of the dictionary space being allocated for string storage. The first entry assigned is the first dictionary entry following the control codewords.

Each dictionary entry consists of a pointer and a character (see, for example, the above-mentioned Sussenguth document) and is linked to a parent entry in the general form in FIG. 2. Creating a new entry consists of writing the character and appropriate link pointers into the memory locations allocated to the entry (see, for example, the technical description of BTLZ mentioned above).

As the dictionary fills up, it is necessary to recover some storage in order that the encoder may be continually adapting to changes in the data stream. The principle described in the technical description of BTLZ has been applied to the modified Mayne algorithm, as it requires little processing overhead and no additional storage.

When the dictionary is full, entries are recovered by scanning the string storage area of the dictionary in simple sequential order. If an entry is a leaf, i.e., is the last character in a string, it is deleted. The search for the next entry to be deleted will begin with the entry after the last one recovered. The storage recovery process is invoked after a new entry has been created, rather than before, this prevents inadvertent deletion of the matched entry.

Not all data is compressible, and even compressible files can contain short periods of uncompressible data. It is desirable therefore that the data compression function can automatically detect loss of efficiency, and can revert to non-compressed or transparent operation. This should be done without affecting normal throughput if possible.

There are two modes of operation, transparent mode and compressed mode.

(I) TRANSPARENT MODE

(a) Encoder

The encoder accepts characters from a Digital Terminative Equipment (DTE) interface, and passes them on in uncompressed form. The normal encoding processing is, however, maintained, and the encoder dictionary updated, as described above. Thus, the encoder dictionary can be adapting to changing data characteristics even when in transparent mode.

(b) Decoder

The decoder accepts uncompressed characters from the encoder, passes the characters through to the DTE interface, and performs the equivalent string matching function. Thus, the decoder actually contains a copy of the encoder function.

(c) Transition from transparent mode

The encoder and decoder maintain a count of the number of characters processed, and the number of bits that these would have encoded in, if compression had been on. As both encoder and decoder perform the same operation of string matching, this is a simple process. After each dictionary update, the character count is tested. When the count exceeds a threshold, ax-f_delay, the compression ratio is calculated. If the compression ratio is greater than 1, compression is turned On and the encoder and decoder enter the compressed mode.

(II) COMPRESSED MODE (a) Encoder

The encoder employs the string matching process described above to compress the character stream read from the DTE interface, and sends the compressed data stream to the decoder.

(b) Decoder

The decoder employs the decoding process described above to recover character strings from received codewords.

(c) Transition to transparent mode

The encoder arbitrarily tests its effectiveness, or the compressibility of the data stream, possibly using the test described above. When it appears that the effectiveness of the encoding process is impaired the encoder transmits an explicit codeword to the decoder to indicate a transition to compressed mode. Data from that point on is sent in transparent form, until the test described in (i) indicates that the system should revert to compressed mode.

The encoder and decoder revert to prefix mode after switching to transparent mode.

A flush operation is provided to ensure that any data remaining in the encoder is transmitted. This is needed as there is a bit oriented element to the encoding and decoding process which is able to store fragments of one byte. The next data to be transmitted will therefore start on a byte boundary. When this operation is used, which can only be in compressed mode, an explicit codeword is sent to permit the decoder to realign its bit oriented process. This is used in the following way:

(a) DTE timeout

When a DTE timeout or some similar condition occurs, it is necessary to terminate any string matching process and flush the encoder. The steps involved are: exit from string matching process, send codeword corresponding to partially matched string, send FLUSHED codeword and flush buffer.

(b) End of buffer

At the end of a buffer, the flush process is not used, unless there is no more data to be sent. The effect of this is to allow codewords to cross frame boundaries. If there is no more data to be sent, the action defined in (a) is taken.

(c) End of message

The process described in (a) is carried out.
An example of a dictionary update is Input string "elephant," strings already in dictionary "ele", "ph"
  Match "ele" and "ph"
  Add "p" to "ele" and "h" to "elep", giving "eleph"
  Match "a" and "n"
  Add "n" to "a" giving "an"
  Match "t" and " "
  Add " " to "t" giving "t "
An example of a transparency check is
Input string "elephant" with matching process as above
  Match "ele" increase character count by 3
  Increase compressed bit count by length of codeword
  Match "ph," increase character count by 2
  Increase compressed bit count by length of codeword
  Add new dictionary entry
  If character count >test internal
  check compressed bits against character count octet size (8)
  if in transparent mode and compressed bits <ch count
  8
  switch to compressed mode else
  if in compressed mode and compressed bits >ch count 8
  switch to transparent mode reset counts
  i.e., "ele"+"ph" "a"+"n" "t"+" "
    test here and    to see if character count exceeds test interval, if it does then compare performance.
An example of a flush operation is Input string as above, however timeout occurs after "p"

(a) Compressed mode

Send codeword for currently matched string, even if incomplete . . . entry corresponding to "p"
Send FLUSHED codeword
Flush bits from bitpacking routing, and re-octet align
Reset encoder to prefix state
Reset string to null state, and wait for next character (b) Transparent Send existing buffer contents The algorithm employed in the present invention is comparable in complexity to the modified Ziv-Lempel algorithm. The memory requirement is 2 bytes per dictionary entry for the first 260 dictionary entries and 7 bytes per entry thereafter, giving for each of the encoder and decoder dictionaries:
1024 entries: 6 Kbytes
2048 entries: 13 Kbytes
4096 entries: 27 Kbytes Processing speed is very fast. For operation at speeds up to 38.4 Kbits over a 9.6 Kbit link, only a Z80 family processor should be required.

Response time is minimized through the use of a timeout codeword, which permits the encoder to detect intermittent traffic (i.e., keyboard operation) and transmit a partially matched string. This mechanism does not interfere with operation under conditions of continuous data flow, when compression efficiency is maximized.

The algorithm described above is ideally suited to the modem environment, as it provides a high degree of compression but may be implemented on a simple inexpensive microprocessor with a small amount of memory.

A range of implementations are possible, allowing flexibility to the manufacturer in terms of speed, performance and cost. This realizes the desire of some manufacturers to minimize implementation cost and of others to provide top performance. The algorithm is, however, well defined and it is thus possible to ensure compatibility between different implementations.

I claim:

1. A data compression system comprising:
   a dictionary arranged to store strings of characters with an index for each of said strings, and
   means for matching strings of characters of a data stream with strings of characters stored in the dictionary and for outputting the index of a dictionary entry of a matched string when a following character of the data stream does not match with the stored strings,
   said means for matching including means for determining, for a matched string having at least three characters, a sequence of characters from said at least three characters, said sequence including at least a first and a second of said at least three characters, but not including all of said at least three characters, to update the dictionary by extending an immediately- preceding string by said sequence.

2. A system according to claim 1, in which the means for matching determines said sequence so as to comprise only said first said second of said at least three characters.

3. In a method of data compression of individual sequences of characters in a data stream including the steps of storing strings in a dictionary, and determining the longest string in the dictionary which matches a current string in the data stream staring from a current input position, the improvement comprising the steps of:
   determining, for a matched string having at least three characters, a single sequence of characters from said at least three characters, said single sequence including at least a first and a second of said at least three characters, but not including all of said at least three characters, and
   updating the dictionary by extending an immediately-preceding string by said single sequence.

4. A method according to claim 3, wherein the determining step determines a single sequence constituted by only said first and said second of said at least three characters.

5. A method for updating dynamically compiled dictionary entries in a data compression system that generates an output code corresponding to a matched data string S' of successively encountered input characters found as an existing dictionary entry followed by a further matched string S of input characters also found as an existing dictionary entry, said method comprising the steps of
   creating a new dictionary entry for a character string S'+S" where string S" is of shorter length than string S if string S is greater than two characters in length.

* * * * *

UNITED STATES PATENT AND TRADEMARK OFFICE
CERTIFICATE OF CORRECTION

PATENT NO. : 5,253,325
DATED      : October 12, 1993
INVENTOR(S) : Alan D. CLARK It is certified that error appears in the above-indentified patent and that said Letters Patent is hereby corrected as shown below:

Column 8, lines 27 - 29 should be changed to read as follows:

-- i.e. "ele" + "ph",    "a" and "n",    "t" + " "
             ∧ test here and ∧ to see if character count exceed
       test interval, if it does then compare performance. --

Signed and Sealed this

Sixteenth Day of August, 1994

Attest:

BRUCE LEHMAN

Attesting Officer    *Commissioner of Patents and Trademarks*